(12) United States Patent
Chang

(10) Patent No.: US 9,166,188 B1
(45) Date of Patent: Oct. 20, 2015

(54) ORGANIC LIGHT EMITTING DIODE DEVICE

(71) Applicant: Arolltech Co., Ltd., Taipei (TW)

(72) Inventor: Yih Chang, New Taipei (TW)

(73) Assignee: Arolltech Co., Ltd., Taipei (TW)

( * ) Notice: Subject to any disclaimer, the term of this patent is extended or adjusted under 35 U.S.C. 154(b) by 0 days.

(21) Appl. No.: 14/300,399

(22) Filed: Jun. 10, 2014

(51) Int. Cl.
*H01L 29/08* (2006.01)
*H01L 51/52* (2006.01)

(52) U.S. Cl.
CPC ........ *H01L 51/5209* (2013.01); *H01L 51/5221* (2013.01)

(58) Field of Classification Search
CPC ......... H01L 27/32; H01L 51/00; H01L 27/12; H01L 51/56; H01L 51/44; H01L 51/52
USPC ................. 257/40; 438/26, 64, 151
See application file for complete search history.

(56) References Cited

U.S. PATENT DOCUMENTS

| | | | | |
|---|---|---|---|---|
| 6,727,645 | B2* | 4/2004 | Tsujimura et al. | 313/504 |
| 7,148,502 | B2* | 12/2006 | Yamazaki et al. | 257/40 |
| 7,612,499 | B2* | 11/2009 | Tsujimura et al. | 313/506 |
| 7,800,100 | B2* | 9/2010 | Lee et al. | 257/40 |
| 2004/0051445 | A1* | 3/2004 | Adachi | 313/504 |
| 2007/0240914 | A1* | 10/2007 | Lai et al. | 178/18.06 |
| 2008/0179590 | A1* | 7/2008 | Mancevski | 257/40 |
| 2008/0230773 | A1* | 9/2008 | Dickey et al. | 257/40 |
| 2009/0001362 | A1* | 1/2009 | Toguchi et al. | 257/40 |
| 2009/0065767 | A1* | 3/2009 | Reynolds et al. | 257/40 |
| 2010/0097295 | A1* | 4/2010 | Kwak | 345/32 |
| 2010/0181558 | A1* | 7/2010 | Yamashita et al. | 257/40 |
| 2010/0231124 | A1* | 9/2010 | Song | 313/504 |
| 2011/0095275 | A1* | 4/2011 | Li et al. | 257/40 |
| 2011/0108816 | A1* | 5/2011 | Wirtz et al. | 257/40 |
| 2011/0176304 | A1* | 7/2011 | Kim et al. | 362/235 |
| 2011/0281070 | A1* | 11/2011 | Mittal et al. | 428/142 |
| 2012/0091436 | A1* | 4/2012 | Forrest et al. | 257/40 |
| 2012/0119642 | A1* | 5/2012 | Chang | 313/504 |
| 2012/0132930 | A1* | 5/2012 | Young et al. | 257/84 |
| 2013/0056244 | A1* | 3/2013 | Srinivas et al. | 174/250 |
| 2013/0112955 | A1* | 5/2013 | Yamazaki et al. | 257/40 |
| 2013/0187148 | A1* | 7/2013 | Schwab et al. | 257/40 |
| 2013/0270525 | A1* | 10/2013 | Miyairi et al. | 257/40 |
| 2014/0209887 | A1* | 7/2014 | Chang | 257/40 |
| 2014/0225871 | A1* | 8/2014 | Kim et al. | 345/176 |
| 2014/0299843 | A1* | 10/2014 | Kim | 257/40 |
| 2014/0319482 | A1* | 10/2014 | Dobbertin et al. | 257/40 |
| 2014/0339521 | A1* | 11/2014 | Ozawa | 257/40 |
| 2014/0346484 | A1* | 11/2014 | Nendai et al. | 257/40 |
| 2015/0034929 | A1* | 2/2015 | Ide et al. | 257/40 |
| 2015/0053964 | A1* | 2/2015 | Fujimura et al. | 257/40 |
| 2015/0076106 | A1* | 3/2015 | Pellerite et al. | 216/13 |
| 2015/0123098 | A1* | 5/2015 | Kang | 257/40 |

* cited by examiner

*Primary Examiner* — Caleb Henry

(74) *Attorney, Agent, or Firm* — John A. Fortkort; Fortkort & Houston P.C.

(57) ABSTRACT

An OLED device includes: a first insulator sheet; a light-emitting stack stacked with the first insulator sheet and including a transparent anode layer, a cathode layer, and a functional layer; a metallic mesh stacked with the anode layer in a vertical direction, the metallic mesh contacting the anode layer and being covered by the anode layer; a second insulator sheet stacked with the cathode layer in the vertical direction; a plurality of cathode-connecting vias extending through the second insulator sheet; and a cathode-connecting metallic layer stacked with the second insulator sheet in the vertical direction and connected electrically to the cathode layer through the cathode-connecting vias.

8 Claims, 5 Drawing Sheets

ORGANIC LIGHT EMITTING DIODE DEVICE

BACKGROUND OF THE INVENTION

1. Field of the Invention

This invention relates to an organic light emitting diode device, more particularly to an organic light emitting diode device including an anode layer and a metallic mesh stacked with the anode layer.

2. Description of the Related Art

Organic light emitting diodes (OLEDs) are useful for lighting. A conventional OLED device normally includes a transparent substrate, a transparent anode layer of indium tin oxide (ITO) formed on the transparent substrate, an active (or functional) layer of a conductive polymer formed on the anode layer, and a cathode layer formed on the active layer. The conventional OLED device is electrically activated by injecting an electric current to a peripheral side of the anode layer through a metallic busbar which is connected to an external power source. Since ITO has a much higher resistivity compared to a metallic material, the anode layer may suffer from a poor current distribution over the entire area thereof when the electric current is injected to the peripheral side of the anode layer, which results in a non-uniform illumination throughout the entire area of the active layer. In addition, since ITO is brittle, the OLED device is susceptible to deterioration due to bending or deformation thereof.

SUMMARY OF THE INVENTION

Therefore, the object of the present invention is to provide an OLED device that can overcome the aforesaid drawbacks associated with the prior art.

According to this invention, there is provided an OLED device that comprises: a first insulator sheet; a light-emitting stack stacked with the first insulator sheet and including a transparent anode layer, a cathode layer, and a functional layer stacked between the anode layer and the cathode layer in a vertical direction and made from an organic electroluminescent material; a metallic mesh stacked with the anode layer in the vertical direction and including a plurality of first metallic nano-wires and a plurality of second metallic nano-wires intersecting the first metallic nano-wires, the metallic mesh contacting the anode layer and being covered by the anode layer; a second insulator sheet stacked with the cathode layer in the vertical direction and having first and second surfaces that are opposite to each other in the vertical direction, the light-emitting stack and the metallic mesh being stacked between the first and second insulator sheets; a plurality of cathode-connecting vias extending through the first and second surfaces of the second insulator sheet; and a cathode-connecting metallic layer stacked with the second insulator sheet in the vertical direction and connected electrically to the cathode layer through the cathode-connecting vias.

BRIEF DESCRIPTION OF THE DRAWING

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
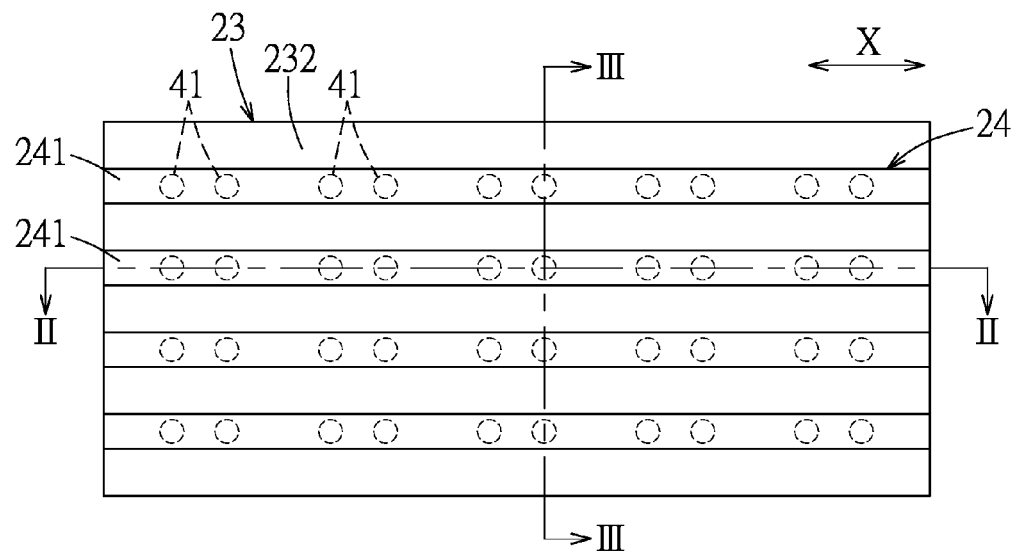
FIG. 1 is a schematic top view of the first preferred embodiment of an OLED device according to the present invention.
Figure 2:
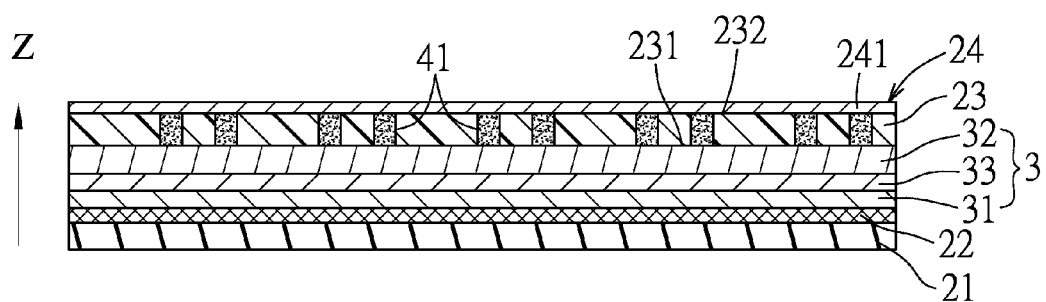
FIG. 2 is a sectional view taken along line II-II of FIG. 1.
Figure 3:
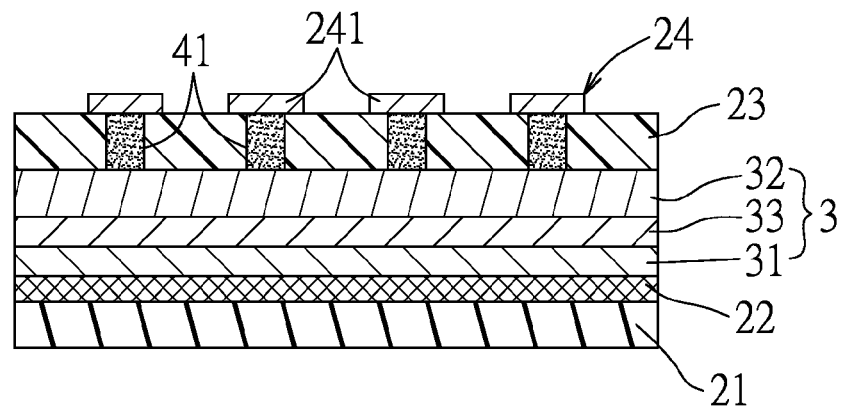
FIG. 3 is a sectional view taken along line III-III of FIG. 1.
Figure 4:
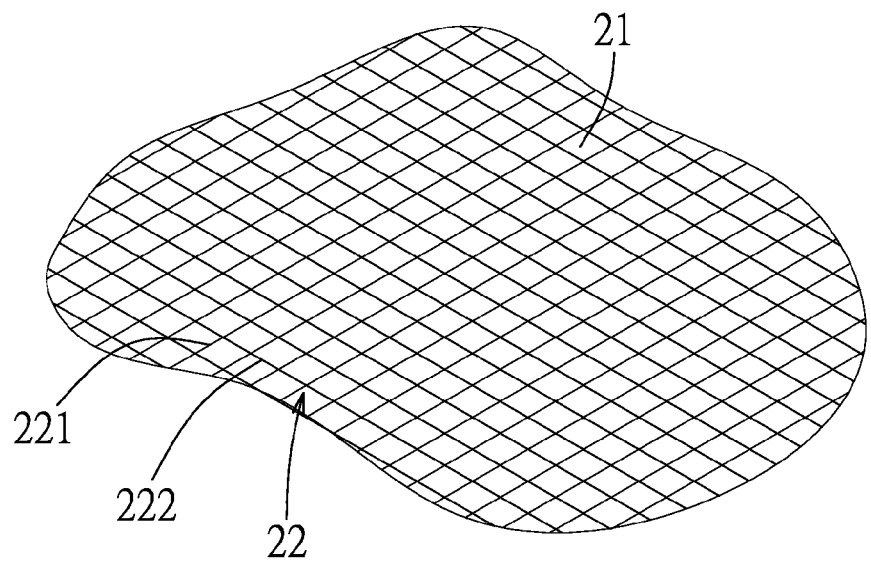
FIG. 4 is a schematic top view of an assembly of a metallic mesh and an insulator sheet of the first preferred embodiment.

Before the present invention is described in greater detail with reference to the accompanying preferred embodiments, it should be noted herein that like elements are denoted by the same reference numerals throughout the disclosure.

FIGS. 1 to 4 illustrate the first preferred embodiment of an OLED device according to this invention. The OLED device includes: a first insulator sheet 21; a light-emitting stack 3 stacked with the first insulator sheet 21 and including a transparent anode layer 31, a cathode layer 32, and a functional layer 33 stacked between the anode layer 31 and the cathode layer 32 in a vertical direction (Z) and made from an organic electroluminescent material; a metallic mesh 22 stacked with the anode layer 31 in the vertical direction (Z) and including a plurality of spaced apart first metallic nano-wires 221 and a plurality of spaced apart second metallic nano-wires 222 intersecting the first metallic nano-wires 221 (see FIG. 4), the metallic mesh 22 contacting the anode layer 31 and being covered by the anode layer 31; a second insulator sheet 23 stacked with the cathode layer 32 in the vertical direction (Z) and having first and second surfaces 231, 232 that are opposite to each other in the vertical direction (Z), the light-emitting stack 3 and the metallic mesh 22 being stacked between the first and second insulator sheets 21, 23; a plurality of cathode-connecting vias 41 extending in the vertical direction (Z) through the first and second surfaces 231, 232 of the second insulator sheet 23; and a cathode-connecting metallic layer 24 stacked with the second insulator sheet 23 in the vertical direction (Z) and connected electrically to the cathode layer 32 through the cathode-connecting vias 41. The first and second metallic nano-wires 221, 222 have a diameter ranging from 10 nm to 10000 nm.

In this embodiment, the cathode-connecting metallic layer 24 includes a plurality of conductive cathode-connecting lines 241 that extend in a longitudinal direction (X) transverse to the vertical direction (Z) and that are made from a metal, such as copper, nickel, silver, or gold. The cathode-connecting vias 41 are preferably made from a conductive paste, such as a silver paste. The first and second insulator sheets 21, 23 are preferably made from a material, such as poly(ethylene terephthalate) (PET) or glass. The metallic mesh 22 is preferably made from a metal, such as silver or copper, and may be formed on the first insulator sheet 21 through printing techniques. The cathode-connecting metallic layer 24 is adapted to be connected to a cathode of an external power source (not shown) through an integrated circuit controller (not shown).

In this embodiment, the first insulator sheet 21 is flexible and transparent.

Figure 5:
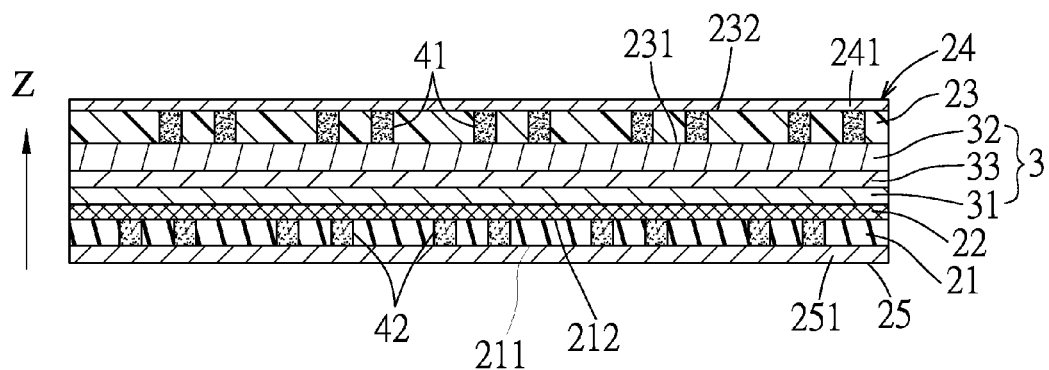
FIG. 5 is a sectional view of the second preferred embodiment of the OLED device according to the present invention.
Figure 6:
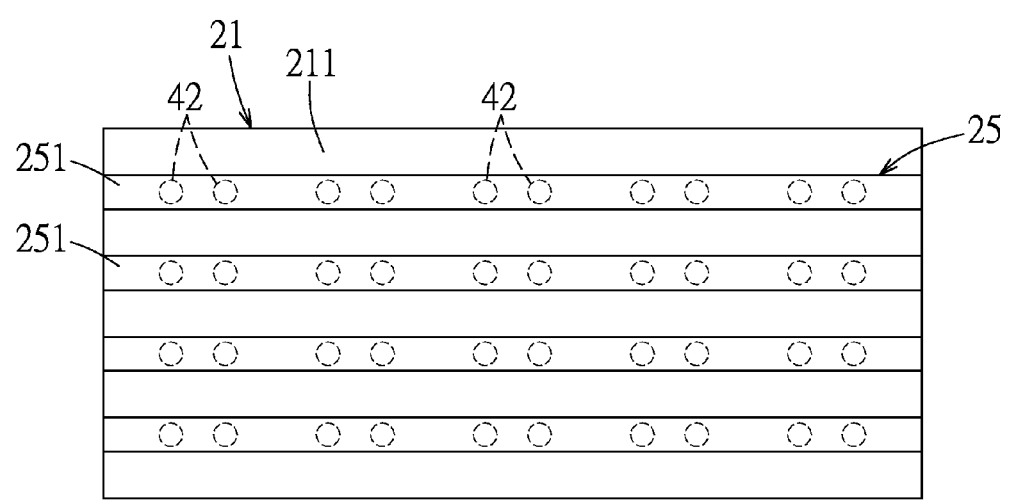
FIG. 6 is a schematic bottom view of the second preferred embodiment.

FIGS. 5 and 6 illustrate the second preferred embodiment of the OLED device according to the present invention. The second preferred embodiment differs from the previous embodiment in that the OLED device further includes an anode-connecting metallic layer 25 and a plurality of conductive anode-connecting vias 42. The first insulator sheet 21 has first and second surfaces 211, 212 that are opposite to each other in the vertical direction (Z). The anode-connecting metallic layer 25 is formed on the first surface 211 of the first insulator sheet 21. The anode-connecting vias 42 extend in the vertical direction (Z) through the first and second surfaces 211, 212 of the first insulator sheet 21 to contact the anode-connecting metallic layer 25 and the metallic mesh 22.

In this embodiment, the anode-connecting metallic layer 25 includes a plurality of anode-connecting lines 251 that are spaced apart from one another and that extend in the longitudinal direction (X). Alternatively, the anode-connecting lines 251 may extend in a transverse direction (not shown) transverse to the vertical direction (Z) and the longitudinal direction (X). Each of the anode-connecting lines 251 contacts respective ones of the anode-connecting vias 42.

Figure 7:
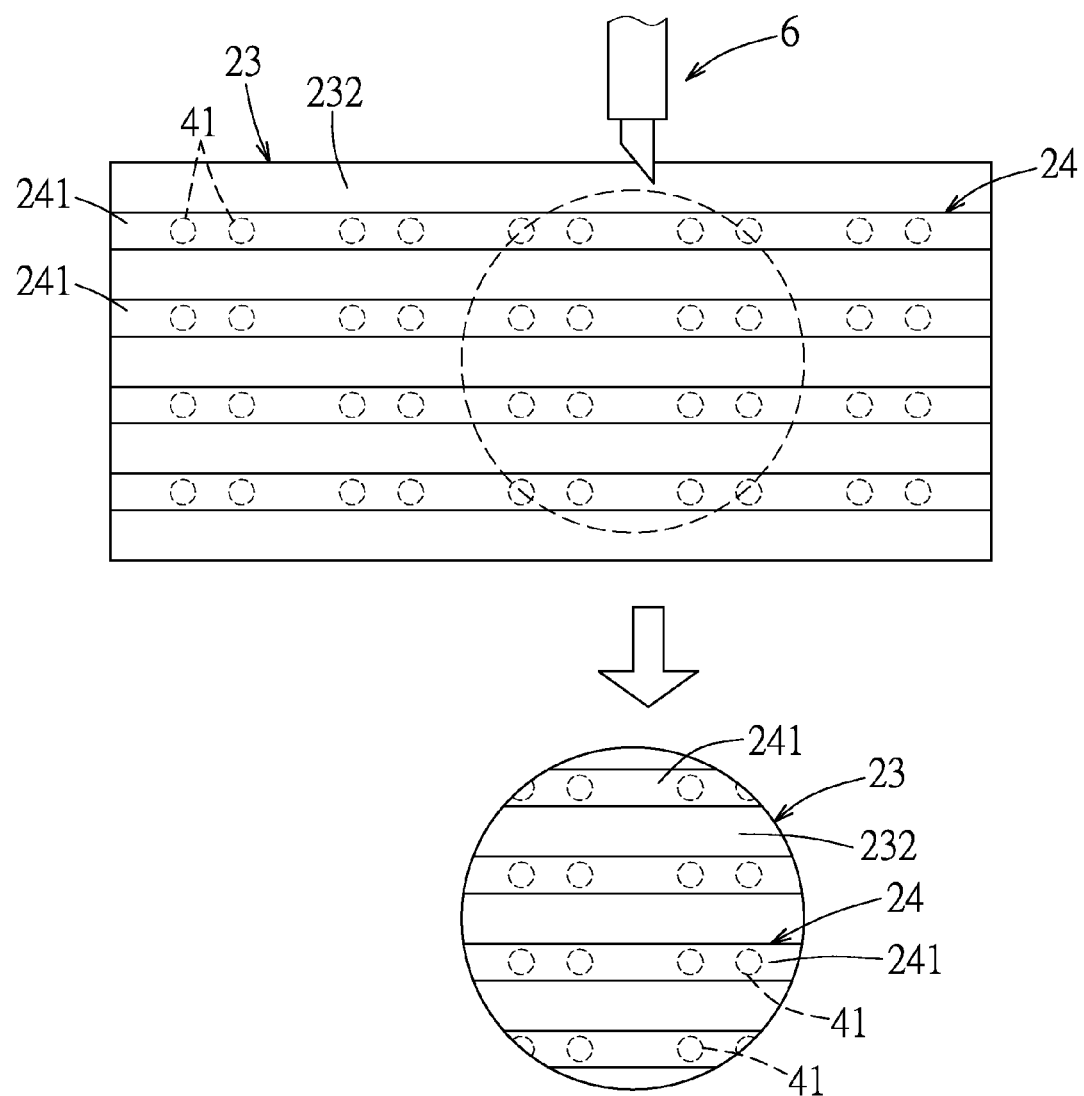
FIG. 7 is a schematic view illustrating how the second preferred embodiment is cut into a circular OLED device.

The OLED device of the second preferred embodiment can be cut into a desired shape and size according to actual requirements. As illustrated in FIG. 7, the OLED device of the second preferred embodiment can be easily cut into a circular OLED device using a tool 6 without damaging the OLED device thus formed. In addition, the OLED device of the present invention may be produced by a roll-to-roll process for mass production.

Figure 8:
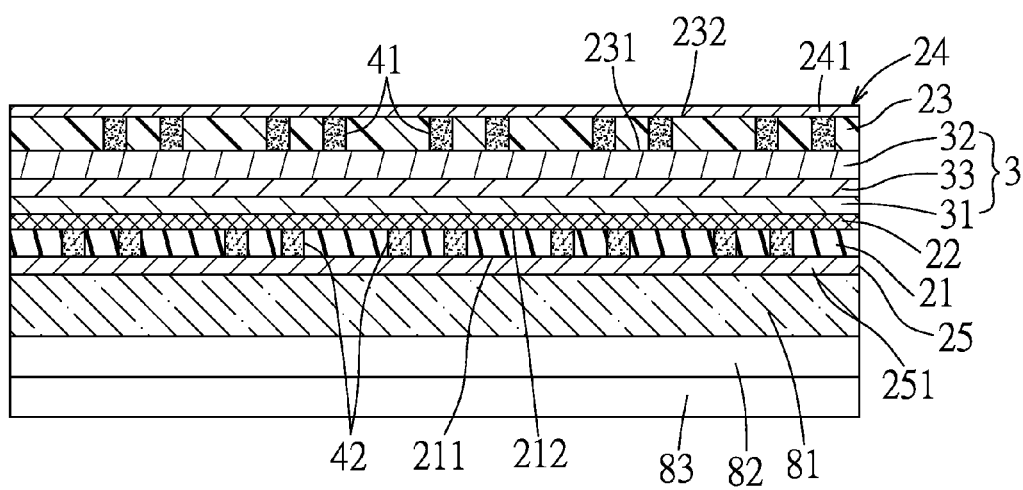
FIG. 8 is a sectional view of the third preferred embodiment of the OLED device according to the present invention.

FIG. 8 illustrates the third preferred embodiment of the OLED device according to the present invention. The third preferred embodiment differs from the second preferred embodiment in that the third preferred embodiment further includes a transparent substrate 81, a touch panel 82 and a light diffuser plate 83. The touch panel 82 is stacked between the transparent substrate 81 and the light diffuser plate 83 along the vertical direction (Z), and may be a capacitive type touch panel or a resistive type touch panel. The transparent substrate 81 is stacked between the touch panel 82 and the anode-connecting metallic layer 25 along the vertical direction (Z), and is preferably made from a material, such as glass or PET.

With the inclusion of the metallic mesh 22 and the cathode-connecting vias 41 in the OLED device of the present invention, the aforesaid drawbacks associated with the prior art can be overcome. In addition, with further inclusion of the anode-connecting vias 42 and the anode-connecting metallic layer 25 in the OLED device of the present invention, the OLED device can be cut into a desired shape and size according to the actual requirements.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. An organic light-emitting diode (OLED) device comprising:
  a first insulator sheet;
  a light-emitting stack stacked with said first insulator sheet and including a transparent anode layer, a cathode layer, and a functional layer stacked between said anode layer and said cathode layer in a vertical direction and made from an organic electroluminescent material;
  a metallic mesh stacked with said anode layer in the vertical direction and including a plurality of first metallic nano-wires and a plurality of second metallic nano-wires intersecting said first metallic nano-wires, said metallic mesh contacting said anode layer and being covered by said anode layer;
  a second insulator sheet stacked with said cathode layer in the vertical direction and having first and second surfaces that are opposite to each other in the vertical direction, said light-emitting stack and said metallic mesh being stacked between said first and second insulator sheets;
  a plurality of cathode-connecting vias extending through said first and second surfaces of said second insulator sheet; and
  a cathode-connecting metallic layer stacked with said second insulator sheet in the vertical direction and connected electrically to said cathode layer through said cathode-connecting vias.

2. The OLED device of claim 1, further comprising an anode-connecting metallic layer and a plurality of conductive anode-connecting vias, said first insulator sheet having first and second surfaces that are opposite to each other in the vertical direction, said anode-connecting metallic layer being formed on said first surface of said first insulator sheet, said anode-connecting vias extending through said first and second surfaces of said first insulator sheet to contact said anode-connecting metallic layer and said metallic mesh.

3. The OLED device of claim 2, wherein said anode-connecting metallic layer includes a plurality of anode-connecting lines that are spaced apart from one another, each of said anode-connecting lines contacting respective ones of said anode-connecting vias.

4. The OLED device of claim 3, wherein said cathode-connecting metallic layer includes a plurality of cathode-connecting lines that are formed on said second surface of said second insulator sheet and that are spaced apart from one another, each of said cathode-connecting lines contacting respective ones of said cathode-connecting vias.

5. The OLED device of claim 2, wherein said first insulator sheet is flexible and transparent.

6. The OLED device of claim 2, further comprising a transparent substrate, said anode-connecting lines being sandwiched between said transparent substrate and said first insulator sheet.

7. The OLED device of claim 6, further comprising a touch panel that is attached to said transparent substrate.

8. The OLED device of claim 7, further comprising a light diffuser plate that is attached to said touch panel.

* * * * *